US 6,565,619 B1

(12) United States Patent
Asano et al.

(10) Patent No.: US 6,565,619 B1
(45) Date of Patent: May 20, 2003

(54) POLISHING COMPOSITION AND POLISHING METHOD EMPLOYING IT

(75) Inventors: Hiroshi Asano, Aichi (JP); Kenji Sakai, Aichi (JP); Katsuyoshi Ina, Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 0 days.

(21) Appl. No.: 10/263,846

(22) Filed: Oct. 4, 2002

(30) Foreign Application Priority Data

Oct. 19, 2001 (JP) ........................ 2001-321981

(51) Int. Cl.⁷ .................. C09K 3/14; C01B 33/14; H01L 21/304; C09G 1/02
(52) U.S. Cl. .................. 51/308; 106/3; 438/692; 438/693; 216/106; 216/108
(58) Field of Search ................ 51/308; 106/3; 252/79.1; 438/692, 693; 216/106, 108

(56) References Cited

U.S. PATENT DOCUMENTS

| 5,391,258 A | 2/1995 | Brancaleoni et al. |
| 5,476,606 A | 12/1995 | Brancaleoni et al. |
| 5,575,885 A | 11/1996 | Hirabayashi et al. |
| 5,770,095 A | 6/1998 | Sasaki et al. |
| 5,858,813 A | 1/1999 | Scherber et al. |
| 5,954,997 A | 9/1999 | Kaufman et al. |
| 6,126,853 A | 10/2000 | Kaufman et al. |
| 6,139,763 A | 10/2000 | Ina et al. |
| 6,315,803 B1 | 11/2001 | Ina et al. |
| 6,355,075 B1 | 3/2002 | Ina et al. |

FOREIGN PATENT DOCUMENTS

| EP | 1 046 690 | 10/2000 |

*Primary Examiner*—Michael Marcheschi
(74) *Attorney, Agent, or Firm*—Oblon, Spivak, McClelland, Maier & Neustadt, P.C.

(57) ABSTRACT

A polishing composition comprising:
  (a) colloidal silica having a positively charged surface,
  (b) colloidal silica having a negatively charged surface,
  (c) at least one acid selected from the group consisting of nitric acid, hydrochloric acid, sulfuric acid, lactic acid, acetic acid, oxalic acid, citric acid, malic acid, succinic acid, butyric acid and malonic acid,
  (d) at least one anticorrosive selected from the group consisting of benzotriazole, benzimidazole, triazole, imidazole, tolyltriazole and their derivatives, and
  (e) water.

4 Claims, No Drawings

POLISHING COMPOSITION AND POLISHING METHOD EMPLOYING IT

BACKGROUND OF THE INVENTION

1. Field of the Invention

The present invention relates to a polishing composition to be used for polishing for planarization of the surface of a semiconductor. More particularly, it relates to a polishing composition which provides excellent planarization characteristics in polishing for planarization of the surface of a semiconductor device comprising copper, a tantalum-containing compound and a low dielectric constant insulating material and which is useful for forming an excellent polished surface, and to a polishing method employing such a polishing composition.

2. Discussion of Background

Progress of computer products has been remarkable in recent years, and parts to be used for such products, such as ULSI devices, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly severe.

Further, to cope with an increase in resistance of the wiring and the parasitic capacity due to refinement of the wiring, it has been studied to employ copper instead of tungsten or aluminum, as the wiring material. On the other hand, as an insulating material, it has been studied to use a low dielectric constant insulating material (commonly called "Low-k material") instead of silicon dioxide or silicon oxyfluoride.

When copper is used as the wiring material, copper is hardly processable by anisotropic etching by its nature, and accordingly, it requires the following process.

Namely, after forming wiring grooves and vias on an insulating layer, copper wirings are formed by sputtering or plating (so-called damascene method), and then an unnecessary copper layer deposited on the insulating layer is removed by mechanochemical polishing (Chemical Mechanical Polishing, hereinafter referred to as "CMP") which is a combination of mechanical polishing and chemical polishing.

However, in such a process, it may happen that copper atoms will diffuse into the insulating layer to deteriorate the device properties. Therefore, for the purpose of preventing diffusion of copper atoms, it has been studied to provide a barrier layer on the insulating layer having wiring grooves or vias formed. As a material for such a barrier layer, metal tantalum or a tantalum-containing compound including tantalum nitride, is most suitable from the viewpoint of the reliability of the device and is expected to be employed mostly in the future. For the purpose of the present invention, "a tantalum-containing compound" includes metal tantalum in addition to tantalum nitride, etc., and "copper" includes an alloy of copper with aluminum or the like.

As common Low-k materials to be used as insulating materials, "Black Diamond" (tradename, manufactured by Applied Materials) and "CORAL" (tradename, manufactured by Novellus Systems) may, for example, be mentioned as CVD type materials, and "SiLK" (tradename, manufactured by the Dow Chemical), "FLARE" (tradename, manufactured by Honeywall Electronic Materials) and their porous materials, may, for example, be mentioned as coating type materials. These materials are expected to be used in future.

Accordingly, in such a CMP process for a semiconductor device containing such copper, tantalum-containing compound and Low-k material, firstly the copper (the copper layer) as the outermost layer and then, the tantalum-containing compound (the tantalum-containing compound layer) as the barrier layer, are polished, respectively, and polishing will be completed when it has reached the Low-k material (the Low-k layer).

The above CMP process for forming a semiconductor device containing the above copper, tantalum-containing compound and Low-k material, is carried out usually by a two step polishing process. Namely, firstly, only the copper layer is polished by a first step polishing, and then, the tantalum-containing compound layer and the Low-k layer are simultaneously polished by a second step polishing. For this process, the following two methods are conceivable depending upon the manner of termination of the first step polishing. Firstly, only the copper layer is polished by the first step polishing, and this can be done by two methods i.e. ① a method wherein the polishing is terminated before reaching to the barrier layer (the tantalum-containing compound layer) while the copper layer of from 1,000 to 2,000 Å still remains, and ② a method wherein all of the copper layer to be removed is polished and removed, and the polishing is completed after reaching the barrier layer (the tantalum-containing compound layer). When polishing is carried out by the above method ②, on completion of the first step polishing, dishing or erosion is likely to be observed at the copper wiring portion. In order to obtain a polished surface free from such dishing or erosion, it is advisable to terminate the first step polishing by the above method ① and then to carry out a step of polishing the remaining copper layer simultaneously together with the tantalum-containing compound layer and the Low-k layer at the same stock removal rate by the second step polishing.

Here, "dishing" means that the copper wiring after polishing is recessed as compared with the Low-k layer, and "erosion" means that a densely wired portion is recessed as compared with other portions.

With respect to the above polishing composition for the first step polishing, JP-A-7-233485 discloses a polishing liquid for a copper type metal layer, which comprises at least one organic acid selected from aminoacetic acid and amidesulfuric acid, an oxidizing agent and water, and a method for producing a semiconductor device using such a polishing liquid.

When this polishing liquid is used for polishing a copper layer, a relatively high stock removal rate (usually at a level of 5,000 Å/min) can be obtained. It is considered that copper atoms on the copper layer surface become copper ions by the action of the oxidizing agent, and such copper ions are taken by said at least one organic acid selected from aminoacetic acid and amidesulfuric acid, whereby a high stock removal rate can be obtained. This polishing composition is useful as a polishing composition for the first step polishing i.e. as a polishing composition for the purpose of polishing a copper layer at a high stock removal rate.

On the other hand, with respect to a polishing composition for the second step polishing, the present inventors have already proposed a polishing composition comprising an abrasive, an oxidizing agent capable of oxidizing tantalum, a reducing agent capable of reducing tantalum oxide, and water, and a polishing method employing it (JP-A-2000-160139), and, as a first improvement thereof, a polishing composition comprising an abrasive, oxalic acid, an ethylene diamine derivative, a benzotriazole derivative and water, as well as a polishing composition comprising an abrasive, oxalic acid, an ethylene diamine derivative, a benzotriazole derivative, hydrogen peroxide and water (JP-A-2001-89747). These inventions relate to polishing compositions useful for a case where silicon dioxide or silicon oxyfluoride is used as an insulating material.

However, when such conventional polishing compositions are used for polishing of a Low-k material, it has been very difficult to polish the Low-k material at a sufficient stock removal rate. Therefore, it has been difficult to polish copper, a tantalum-containing compound and a Low-k material at the same and high stock removal rate. Accordingly, it has been desired to have a polishing composition suitable for such a process developed.

SUMMARY OF THE INVENTION

The present invention has been made to solve the above-mentioned problem and to provide a polishing composition capable of polishing copper, a tantalum-containing compound and a Low-k material at a substantially same and high stock removal rate in the CMP process for the production of a semiconductor device containing copper, a tantalum-containing compound and a Low-k material, and a polishing method employing it.

The polishing composition of the present invention is one comprising (a) colloidal silica having a positively charged surface, (b) colloidal silica having a negatively charged surface, (c) at least one acid selected from the group consisting of nitric acid, hydrochloric acid, sulfuric acid, lactic acid, acetic acid, oxalic acid, citric acid, malic acid, succinic acid, butyric acid and malonic acid, (d) at least one anticorrosive selected from the group consisting of benzotriazole, benzimidazole, triazole, imidazole, tolyltriazole and their derivatives, and (e) water.

The polishing composition of the present invention is characterized in that the colloidal silica (a) having a positively charged surface, has its surface surface-treated with alumina or zirconia.

The polishing composition of the present invention is further characterized in that it further contains (f) at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether.

The polishing method of the present invention is a method for polishing a semiconductor device comprising at least copper, a tantalum-containing compound and a low dielectric constant insulating material, on a substrate, with the polishing composition as defined above.

Now, the present invention will be described in further detail. It should be understood that the following description is intended to facilitate the understanding of the present invention and is by no means intended to restrict the present invention.

Colloidal Silica Having a Positively Charged Surface

The polishing composition of the present invention contains two types of colloidal silica. The first type is colloidal silica having a positively charged surface. The colloidal silica having a positively charged surface has a function to accelerate polishing of the Low-k layer. Accordingly, if the content of the colloidal silica having a positively charged surface is increased, the stock removal rate of the Low-k layer will be high. On the other hand, if its amount is decreased, the stock removal rate of the Low-k layer will be low. On the other hand, against the copper layer, it has an effect to accelerate the polishing to some extent, but such an effect is not remarkable. Further, against the tantalum-containing compound film, it presents no substantial influence over the stock removal rate.

As the colloidal silica having a positively charged surface, it is preferred to employ, for example, one having its surface treated with alumina or zirconia. Alumina and zirconia will be positively charged in a state where the pH is low. Accordingly, by treating the surface of colloidal silica with alumina or zirconia, the colloidal silica surface can be positively charged. As a method for treating the surface of colloidal silica with alumina or zirconia, a method of reacting colloidal silica with an organic aluminum compound or with an organic zirconia compound in a solvent may, for example, be mentioned. However, the method is not limited to such a method, and may be carried out by any other optional treatment.

It is possible to ascertain whether or not the surface of colloidal silica is positively charged, by measuring the surface potential of colloidal silica by means of zeta potentiometer. Usually, if the surface potential by the zeta potentiometer is at least 5 mV, it can be said that the colloidal silica is positively charged. The colloidal silica to be incorporated in the polishing composition of the present invention is preferably one having a surface potential of from 10 mV to 40 mV, more preferably from 15 mV to 30 mV. Further, it is possible to ascertain whether or not the surface is treated with alumina or zirconia, for example, by a measurement by means of an energy dispersive X-ray spectrometer.

The content of the colloidal silica having a positively charge surface is preferably from 50 to 400 g/l, more preferably from 100 to 300 g/l based on the entire composition. If the content is too small, the stock removal rate of the Low-k layer will be too low, such being undesirable. On the other hand, if the content is too large, although the stock removal rate of the Low-k layer will be high, the colloidal silica particles tend to agglomerate one another, whereby abrasion scratches are likely to be led, or the polishing composition is likely to undergo gelation, such being undesirable.

The particle size of the colloidal silica having a positively charged surface is preferably within a range of from to 100 nm, more preferably from to 50 nm. If the particle size is too small, the stock removal rate of the Low-k layer will be too low, such being undesirable. On the other hand, if the particle size is too large, although the stock removal rate of the Low-k layer will be high, the polishing composition tends to precipitate, or abrasion scratches are likely to be led, such being undesirable. Here, the particle size is meant for the particle size calculated from the specific surface area measured by a nitrogen adsorption method (BET method). However, the particle size may otherwise be a particle size measured by electron microscopic observation (SEM or TEM), and even in such a case, the particle size is preferably substantially the same as mentioned above.

Colloidal Silica Having a Negatively Charged Surface

The second type of colloidal silica incorporated to the polishing composition of the present invention is colloidal silica having a negatively charged surface. Usually, colloidal silica is negatively charged in all pH ranges. Accordingly, usual colloidal silica may be employed as it is, and it is unnecessary to apply any special treatment to have the surface negatively charged. Usual colloidal silica is known to have a surface potential of from −40 mV to −5 mV, and it may be used as colloidal silica to be incorporated to the polishing composition of the present invention, unless the surface potential is departed substantially from such a range.

This colloidal silica having a negatively charged surface will work together with the after-mentioned acid to accelerate polishing of the tantalum-containing compound layer. Further, against the copper layer, it has an effect to accelerate polishing to some extent, but such an effect is not remarkable. On the other hand, against the Low-k layer, it presents no substantial influence over the stock removal rate.

The content of the colloidal silica having a negatively charged surface is preferably from to 200 g/l, more preferably from to 100 g/l, based on the entire composition. If the content is too small, the stock removal rate of the tantalum-containing compound layer will be too low, such being undesirable. On the other hand, if the content is too large, although the stock removal rate of the tantalum-containing compound layer will be high, the colloidal silica particles tend to agglomerate one another, whereby abrasion scratches are likely to be led, or the polishing composition tends to undergo gelation, such being undesirable.

The particle size of the colloidal silica having a negatively charged surface is preferably within a range of from 2 to 50 nm, more preferably from 5 to 40 nm. It is practically difficult to produce colloidal silica having a particle size of less than 2 nm, since the particles tend to be unstable. If the particle size is too large, the polishing composition tends to precipitate, and abrasion scratches are likely to be led, such being undesirable.

Acid

The polishing composition of the present invention contains at least one acid selected from the group consisting of nitric acid, hydrochloric acid, sulfuric acid, lactic acid, acetic acid, oxalic acid, citric acid, malic acid, succinic acid, butyric acid and malonic acid. The acid contained in the polishing composition of the present invention plays a role of accelerating the stock removal rate of the tantalum-containing compound layer. From the viewpoint of acceleration of polishing of the tantalum-containing compound layer and corrosiveness to the copper layer, it is preferred to employ nitric acid, hydrochloric acid, sulfuric acid, lactic acid, acetic acid, oxalic acid, citric acid, malic acid, succinic acid, butyric acid or malonic acid, among them, and it is more preferred to employ nitric acid or lactic acid.

The content of the acid is preferably within a range of from 1 to g/l, more preferably from 3 to g/l, based on the entire composition. If the content of the acid is too small, the stock removal rate of the tantalum-containing compound layer will be too low, such being undesirable. On the other hand, if the content of the acid is too large, although the stock removal rate of the tantalum-containing compound layer will be high, the stock removal rate of the Low-k layer tends to be low, and the pH tends to be too low, whereby there may be a problem from the viewpoint of transportation when the waste water is to be treated.

Anticorrosive

The polishing composition of the present invention contains at least one anticorrosive selected from the group consisting of benzotriazole, benzimidazole, triazole, imidazole, tolyltriazole and their derivatives. Here, the derivatives may, for example, be, as derivatives of benzotriazole, those having hydrogen atoms of the benzene ring of benzotriazole substituted by alkyl groups, or mixtures containing them. Such an anticorrosive is incorporated to reduce the stock removal rate of the copper layer to a desired level and to prevent corrosion of the copper layer surface after polishing. Further, it presents no substantial influence over the stock removal rate of the tantalum-containing compound layer or the Low-k layer.

The content of the anticorrosive is preferably within a range of from 0.05 to 1 g/l, more preferably from 0.01 to 0.5 g/l, based on the entire composition. If the content of the anticorrosive is too small, the stock removal rate of the copper layer tends to be too high, such being undesirable. On the other hand, if the content of the anticorrosive is too large, polishing of the copper layer will be suppressed, whereby the stock removal rate of the copper layer tends to be too low. Further, the anticorrosive itself is hardly soluble in water by its nature, whereby dissolution of the anticorrosive during the production tends to be difficult, or it may precipitate at a low temperature during the storage or transportation, such being undesirable.

Water

The polishing composition of the present invention contains water. As such water, it is preferred to use one having impurities reduced as far as possible, so that the above-described components can perform their respective roles properly. Namely, it is preferred to use distilled water or one having impurity ions removed by an ion exchange resin and having foreign matters removed by a filter.

Organic compound

The polishing composition of the present invention may contain at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether, as the case requires. The general formulae of these organic compounds are shown in Table 1. Such an organic compound has a function to prevent agglomeration between the colloidal silica having a positively charged surface and the colloidal silica having a negatively charged surface and thereby to suppress abrasion scratches due to agglomeration of the colloidal silica. Among these organic compounds, it is preferred to employ polyethylene oxide which is inexpensive and easy to handle.

TABLE 1

| Names of substances | General formulae |
| --- | --- |
| Polyethylene oxide (polyethylene glycol) | $H-(OCH_2CH_2)_n-OH$ |
| polypropylene oxide (polypropylene glycol) | $H-(OCH(CH_3)CH_2)_m-OH$ |
| Polyoxyethylene alkyl ether | $R-O-(CH_2CH_2O)_n-H$ |
| Polyoxypropylene alkyl ether | $R-O-(CH_2CH(CH_3)O)_m-H$ |
| Polyoxyethylenepolyoxypropylene alkyl ether | $R-O-(CH_2CH(CH_3)O)_m-(CH_2CH_2O)_n-H$ |

In the above formulae, R is an alkyl group, m is an integer corresponding to the added mols of propylene oxide, and n is an integer corresponding to the added mols of ethylene oxide.

The content of the organic compound is preferably within a range of at most 100 g/l, preferably from 1 to g/l, based on the entire composition. If the organic compound is not incorporated, agglomeration may take place between the colloidal silica having a positively charged surface and the colloidal silica having a negatively charged surface, whereby abrasion scratches may be likely to form on the polished surface due to such agglomeration. On the other hand, if the content of the organic compound is too large, the stock removal rate of the tantalum-containing compound layer or the Low-k layer tends to be low, such being undesirable.

Polishing Composition

The polishing composition of the present invention is prepared by mixing and dissolving or dispersing the above-described respective components, i.e. the colloidal silica having a positively charged surface, the colloidal silica having a negatively charged surface, at least one acid selected from the group consisting of nitric acid, hydrochloric acid, sulfuric acid, lactic acid, acetic acid, oxalic acid, citric acid, malic acid, succinic acid, butyric acid and malonic acid, and at least one anticorrosive selected from the group consisting of benzotriazole, benzimidazole, triazole, imidazole, tolyltriazole and derivatives thereof, to water. Further, in some cases, it is prepared by further mixing at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether. The colloidal silicas are uniformly dispersed in this composition to form a suspension, and other components are dissolved in water. The order and the method for mixing, dissolving or dispersing these components, are optional. For example, it is possible to employ ultrasonic dispersion or stirring by means of a vane type stirrer.

The pH of the polishing composition of the present invention is preferably within a range of from 1.5 to 4, more preferably from 2 to 3. By adjusting the pH within this range, the colloidal silica having a positively charged surface and the colloidal silica having a negatively charged surface can be co-existent. By adjusting the contents of the respective components, it is possible to adjust the pH of the polishing composition within the above-mentioned range, and such adjustment is preferred. However, a pH controlling agent may further be incorporated for fine adjustment of the stock removal rate and taking into consideration the problem for transportation or influence over the environment. As such a pH controlling agent, when it is desired to change the pH to an acid side, in addition to the above-mentioned acid, carbonic acid, phosphoric acid, glutaric acid, adipic acid, pimelic acid, benzoic acid, salicylic acid or phthalic acid, may, for example, be used. On the other hand, when it is desired to change the pH to an alkali side, it is possible to add e.g. potassium hydroxide, ammonium hydroxide, sodium hydroxide, hydroxylamine, trimethylamine hydroxide, ammonium carbonate, potassium carbonate or sodium carbonate.

Further, the polishing composition of the present invention may be prepared, stored or transported in the form of a stock solution having a relatively high concentration, so that it may be diluted for use at the time of actual polishing operation. The above-mentioned preferred range for the concentration is one for the actual polishing operation. Needless to say, in the case of adopting such a method of use, the stock solution during the storage or transportation is a solution having a higher concentration.

Polishing Method

The polishing method of the present invention comprises polishing a semiconductor device comprising at least copper, a tantalum-containing compound and a Low-k material, on a substrate, with a polishing composition comprising the above-described respective components, i.e. the colloidal silica having a positively charged surface, the colloidal silica having a negatively charged surface, at least one acid selected from the group consisting of nitric acid, hydrochloric acid, sulfuric acid, lactic acid, acetic acid, oxalic acid, citric acid, malic acid, succinic acid, butyric acid and malonic acid, at least one anticorrosive selected from the group consisting of benzotriazole, benzimidazole, triazole, imidazole, tolyltriazole and derivatives thereof, and water, and, in some cases, at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether.

And, by this polishing method, the copper layer, the tantalum-containing compound layer (the barrier layer) and the Low-k layer (the insulating layer) can be polished by substantially the same stock removal rate. Specifically, the respective layers can be polished at a stock removal rate of from 500 to 1,500 Å/min. Accordingly, it is possible to realize an excellent planarization for the semiconductor device after polishing and an excellent polished surface with little abrasion scratches.

Further, this stock removal rate can be adjusted freely by setting of the polishing machine itself. Namely, the stock removal rate can be adjusted by setting the polishing pressure and the linear velocity for the rotational speed of the plate and the carrier. Usually, the stock removal rate is univocally determined by the relational formula of stock removal rate polishing pressure×linear velocity.

Now, the present invention will be described in further detail with reference to Examples. However, it should be understood that the present invention is by no means restricted to such specific Examples.

Test 1

EXAMPLES 1 to 34

Comparative Examples 1 and 2

Contents and Preparation of Polishing Compositions

Colloidal silica having a positively charged surface, having a particle size of 35 nm and a zeta potential of +mV and having the surface treated with the organic aluminum compound, colloidal silica having a negatively charged surface and having a particle size of 30 nm and a zeta potential of −5 mV, nitric acid as an acid, benzotriazole as an anticorrosive, and a polyethylene oxide as an organic compound, were mixed to water so that they would be blended in the proportions as identified in Table 2, to obtain each of the polishing compositions of Examples 1 to 34 and Comparative Examples 1 and 2.

Example 26 is a case where the polyethylene oxide as an organic compound was not incorporated. Example 33 is a case where colloidal silica having a positively charged surface, which had the surface treated with an organic zirconia compound, was used, and the zeta potential was +17 mV. Example 34 is a case where lactic acid was used as an acid.

Comparative Example 1 is a case where colloidal silica having a positively charged surface was not incorporated, and Comparative Example 2 is a case where colloidal silica having a negatively charged surface was not incorporated.

TABLE 2

| No. | Colloidal silica having a positively charged surface g/l | Colloidal silica having a negatively charged surface g/l | Acid (nitric acid) g/l | Anti-corrosive (benzo-triazole) g/l | Organic compound (polyethylene oxide) g/l | Stock removal rate of copper layer Å/min | Stock removal rate of tantalum nitride layer Å/min | Stock removal rate of Low-k layer Å/min |
|---|---|---|---|---|---|---|---|---|
| Ex. 1 | 30 | 50 | 5 | 0.3 | 10 | 361 | 347 | 352 |
| Ex. 2 | 50 | 50 | 5 | 0.3 | 10 | 482 | 404 | 411 |
| Ex. 3 | 100 | 50 | 5 | 0.3 | 10 | 549 | 453 | 523 |
| Ex. 4 | 200 | 50 | 5 | 0.3 | 10 | 626 | 497 | 763 |
| Ex. 5 | 300 | 50 | 5 | 0.3 | 10 | 675 | 539 | 918 |
| Ex. 6 | 400 | 50 | 5 | 0.3 | 10 | 703 | 588 | 1021 |
| Ex. 7 | 450 | 50 | 5 | 0.3 | 10 | 722 | 612 | 1083 |
| Ex. 8 | 200 | 5 | 5 | 0.3 | 10 | 554 | 290 | 678 |
| Ex. 9 | 200 | 10 | 5 | 0.3 | 10 | 575 | 324 | 713 |
| Ex. 10 | 200 | 20 | 5 | 0.3 | 10 | 597 | 387 | 721 |
| Ex. 11 | 200 | 100 | 5 | 0.3 | 10 | 640 | 578 | 782 |
| Ex. 12 | 200 | 200 | 5 | 0.3 | 10 | 678 | 612 | 799 |
| Ex. 13 | 200 | 250 | 5 | 0.3 | 10 | 687 | 635 | 813 |
| Ex. 14 | 200 | 50 | 0.5 | 0.3 | 10 | 481 | 277 | 1020 |
| Ex. 15 | 200 | 50 | 1 | 0.3 | 10 | 534 | 300 | 959 |
| Ex. 16 | 200 | 50 | 3 | 0.3 | 10 | 590 | 423 | 865 |
| Ex. 17 | 200 | 50 | 10 | 0.3 | 10 | 668 | 679 | 570 |
| Ex. 18 | 200 | 50 | 20 | 0.3 | 10 | 696 | 780 | 503 |
| Ex. 19 | 200 | 50 | 30 | 0.3 | 10 | 726 | 911 | 478 |
| Ex. 20 | 200 | 50 | 5 | 0.02 | 10 | 767 | 567 | 863 |
| Ex. 21 | 200 | 50 | 5 | 0.05 | 10 | 712 | 532 | 821 |
| Ex. 22 | 200 | 50 | 5 | 0.1 | 10 | 681 | 522 | 793 |
| Ex. 23 | 200 | 50 | 5 | 0.5 | 10 | 567 | 443 | 754 |
| Ex. 24 | 200 | 50 | 5 | 1 | 10 | 530 | 432 | 729 |
| Ex. 25 | 200 | 50 | 5 | 2 | 10 | 487 | 410 | 718 |
| Ex. 26 | 200 | 50 | 5 | 0.3 | 0 | 519 | 591 | 808 |
| Ex. 27 | 200 | 50 | 5 | 0.3 | 0.5 | 533 | 580 | 804 |
| Ex. 28 | 200 | 50 | 5 | 0.3 | 1 | 561 | 543 | 789 |
| Ex. 29 | 200 | 50 | 5 | 0.3 | 5 | 589 | 513 | 777 |
| Ex. 30 | 200 | 50 | 5 | 0.3 | 20 | 638 | 450 | 732 |
| Ex. 31 | 200 | 50 | 5 | 0.3 | 100 | 643 | 375 | 689 |
| Ex. 32 | 200 | 50 | 5 | 0.3 | 200 | 650 | 324 | 669 |
| Ex. 33 | 200 | 50 | 5 | 0.3 | 10 | 573 | 527 | 698 |
| Ex. 34 | 200 | 50 | Lactic acid 5 | 0.3 | 10 | 660 | 552 | 746 |
| Comp. Ex. 1 | — | 50 | 5 | 0.3 | 10 | 78 | 576 | 53 |
| Comp. Ex. 2 | 200 | — | 5 | 0.3 | 10 | 549 | 201 | 811 |

Polishing Tests

As objects to be polished, a wafer having a copper layer of 10,000 Å formed by electrolytic plating, a wafer having tantalum nitride layer of 2,000 Å formed by sputtering and a wafer having a layer of Low-k material "CORAL" (tradename, manufactured by Novellus Systems) of 5,000 Å formed by CVD, were, respectively, cutout in a square plate shape of 3×3 cm, and the respective layer surfaces were polished under the following conditions by means of the respective polishing compositions of Examples 1 to 34 and Comparative Examples 1 and 2.

Polishing Conditions

Polishing machine: Table Top Polisher (manufactured by Engis)

Polishing pad: IC-1000 (manufactured by Rodel. Nitta K.K.)

Polishing time: one minute

Platen rotational speed: 50 rpm

Carrier rotational speed: 50 rpm

Polishing pressure: 2.6 psi (about 18 kPa)

Feed rate of polishing composition: 50 ml/min

After polishing, the wafers were sequentially washed and dried, and the stock removal rates of the copper layer, the tantalum-nitride layer and the Low-k layer were, respectively, obtained by means of the following apparatus and method. The obtained results are shown in Table 2.

Stock removal rates of the copper layer and the tantalum nitride layer:

Sheet resister VR-120 (manufactured by Kokusai Electric Services (Inc))

Stock removal rate of the Low-k layer:

Optical film pressure measuring apparatus VM-2030 (manufactured by Dainippon Screen Mfg. (Co Ltd))

Measuring method:

The layer thickness within a wafer was measured at five points, and the stock removal rate was calculated from the difference in the layer thickness as between before and after polishing.

As is evident from Table 2, with the polishing composition containing no colloidal silica having a positively charged surface, in Comparative Example 1, the copper layer and the Low-k layer could not substantially be polished. Further, with the polishing composition containing no colloidal silica having a negatively charged surface, in Comparative Example 2, although a sufficient stock removal rate of the Low-k layer was obtained, no adequate stock removal rate of the tantalum nitride layer was obtained.

Whereas, with the respective polishing compositions of Examples 1 to 34, adequate stock removal rates of the copper layer, the tantalum nitride layer and the Low-k layer were obtained. Accordingly, it is evident that when the respective polishing compositions of Examples 1 to 34 are used for the second step polishing, the copper layer, the tantalum-containing compound layer and the Low-k layer can be polished at a substantially same high stock removal rate, and it is possible to obtain excellent planarization after the polishing and an excellent polished surface having little abrasion scratches.

Test 2

EXAMPLES 35 to 45

Contents and Preparation of Polishing Compositions

The particle sizes of the colloidal silica having a positively charged surface and the colloidal silica having a negatively charged surface, were varied as shown in Table 3, and these colloidal silicas, nitric acid as an acid, benzotriazole as an anticorrosive and a polyethylene oxide as an organic compound, were mixed to water so that they were blended in the proportions as shown in Example 4 of Table 2, to obtain each of the polishing compositions of Examples 35 to 45. Here, the zeta potential of the colloidal silica having a positively charged surface was +25 mV, and the zeta potential of the colloidal silica having a negatively charged surface was −5 mV. And, using the respective polishing compositions thus obtained, polishing tests were carried out in the same manner as in Test 1, and the stock removal rates of the copper layer, the tantalum nitride layer and the Low-k layer were, respectively, obtained. The obtained results are shown in Table 3.

TABLE 3

| No. | Particle size of colloidal silica having a positively charged surface nm | Particle size of colloidal silica having a negatively charged surface nm | Stock removal rate of copper layer Å/min | Stock removal rate of tantalum nitride layer Å/min | Stock removal rate of Low-k layer Å/min |
| --- | --- | --- | --- | --- | --- |
| Ex. 35 | 2 | 30 | 410 | 441 | 472 |
| Ex. 36 | 5 | 30 | 422 | 453 | 554 |
| Ex. 37 | 10 | 30 | 492 | 464 | 631 |
| Ex. 4 | 35 | 30 | 626 | 497 | 763 |
| Ex. 38 | 50 | 30 | 645 | 513 | 791 |
| Ex. 39 | 100 | 30 | 689 | 534 | 843 |
| Ex. 40 | 150 | 30 | 739 | 538 | 891 |
| Ex. 41 | 35 | 2 | 428 | 534 | 750 |
| Ex. 42 | 35 | 5 | 451 | 526 | 768 |
| Ex. 4 | 35 | 30 | 626 | 497 | 763 |
| Ex. 43 | 35 | 40 | 612 | 482 | 770 |
| Ex. 44 | 35 | 50 | 640 | 461 | 765 |
| Ex. 45 | 35 | 60 | 657 | 438 | 743 |

As is evident from Table 3, with each of the polishing compositions of Examples 35 to 45, sufficient stock removal rates were obtained with respect to the copper layer, the tantalum nitride layer and the Low-k layer. Accordingly, it is evident that when each of the polishing compositions of Examples 35 to 45 is used for the second step polishing, the copper layer, the tantalum-containing compound layer and the Low-k layer can be polished at a substantially same high stock removal rate, and it is possible to obtain excellent planarization after polishing and an excellent polished surface having little abrasion scratches.

As described in the foregoing, the polishing composition of the present invention comprises (a) colloidal silica having a positively charged surface, (b) colloidal silica having a negatively charged surface, (c) at least one acid selected from the group consisting of nitric acid, hydrochloric acid, sulfuric acid, lactic acid, acetic acid, oxalic acid, citric acid, malic acid, succinic acid, butyric acid and malonic acid, (d) at least one anticorrosive selected from the group consisting of benzotriazole, benzimidazole, triazole, imidazole, tolyltriazole and derivatives thereof, and (e) water.

It is thereby possible that in a CMP process for producing a semiconductor device comprising copper, a tantalum-containing compound and a Low-k material, polishing of the copper, the tantalum-containing compound and the Low-k material can be carried out at a substantially same high stock removal rate, excellent planarization of a semiconductor device after polishing, and an excellent polished surface having little abrasion scratches, can be realized.

In the polishing composition of the present invention, the colloidal silica (a) having a positively charged surface has its surface surface-treated with alumina or zirconia, whereby the surface of the colloidal silica can be positively charged.

The polishing composition of the present invention may further contain (f) at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether, whereby agglomeration between the colloidal silica having a positively charged surface and the colloidal silica having a negatively charged surface, can be prevented, and abrasion scratches due to agglomeration of the colloidal silicas, can be suppressed.

The polishing method of the present invention is a method which comprises polishing a semiconductor device comprising at least copper, a tantalum-containing compound and a Low-k material, on a substrate, with the above-mentioned polishing composition, whereby polishing of the copper, the tantalum-containing compound and the Low-k material can be carried out at a substantially same high stock removal rate, and excellent planarization of a semiconductor device after polishing and an excellent polished surface having little abrasion scratches, can be realized.

The entire disclosure of Japanese Patent Application No. 2001-321981 filed on Oct. 19, 2001 including specification, claims and summary is incorporated herein by reference in its entirety.

What is claimed is:

1. A polishing composition comprising:
   (a) colloidal silica having a positively charged surface,
   (b) colloidal silica having a negatively charged surface,
   (c) at least one acid selected from the group consisting of nitric acid, hydrochloric acid, sulfuric acid, lactic acid, acetic acid, oxalic acid, citric acid, malic acid, succinic acid, butyric acid and malonic acid,
   (d) at least one anticorrosive selected from the group consisting of benzotriazole, benzimidazole, triazole, imidazole, tolyltriazole and their derivatives, and
   (e) water.

2. The polishing composition according to claim 1, wherein the colloidal silica (a) having a positively charged surface, has its surface surface-treated with alumina or zirconia.

3. The polishing composition according to claim 1, which further contains (f) at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether.

4. A polishing method which comprises polishing a semiconductor device comprising at least copper, a tantalum-containing compound and a low dielectric constant insulating material, on a substrate, with the polishing composition as defined in claim 1.

* * * * *